United States Patent [19]
Klos

[11] 3,931,616
[45] Jan. 6, 1975

[54] STORAGE DEVICE DRIVE CIRCUIT

[75] Inventor: Hendrik Klos, Beekbergen, Netherlands

[73] Assignee: U.S. Philips Corporation, New York, N.Y.

[22] Filed: Oct. 10, 1974

[21] Appl. No.: 513,704

[30] Foreign Application Priority Data
Oct. 17, 1973 Netherlands.................... 7314271

[52] U.S. Cl............................. 340/173 R; 307/203
[51] Int. Cl.²..................... G11C 7/00; H03K 19/20
[58] Field of Search ................. 340/173 R, 173 FF; 307/238, 216, 203

[56] References Cited
UNITED STATES PATENTS
3,660,826  5/1972  Lins .................................. 340/173 R
3,740,730  6/1973  Ho et al. ......................... 340/173 R FOREIGN PATENTS OR APPLICATIONS
43-28385  1968  Japan ........................... 340/173 FF Primary Examiner—Stuart N. Hecker
Attorney, Agent, or Firm—Frank R. Trifari; Daniel R. McGlynn

[57] ABSTRACT

A drive circuit for a solid-state store comprises two transistors, only one of which is conductive under the control of a primary drive signal. By means of a capacitor, a second drive signal can be allowed if such signal is sufficiently synchronized with the primary drive signal. This second drive signal is, for example, the write command signal which appears approximately simultaneously with the primary drive signal during a write operation. In the latter case, the signal appearing first is effective. Tolerances at the instant of appearance of the two drive signals are thus rendered ineffective.

6 Claims, 3 Drawing Figures

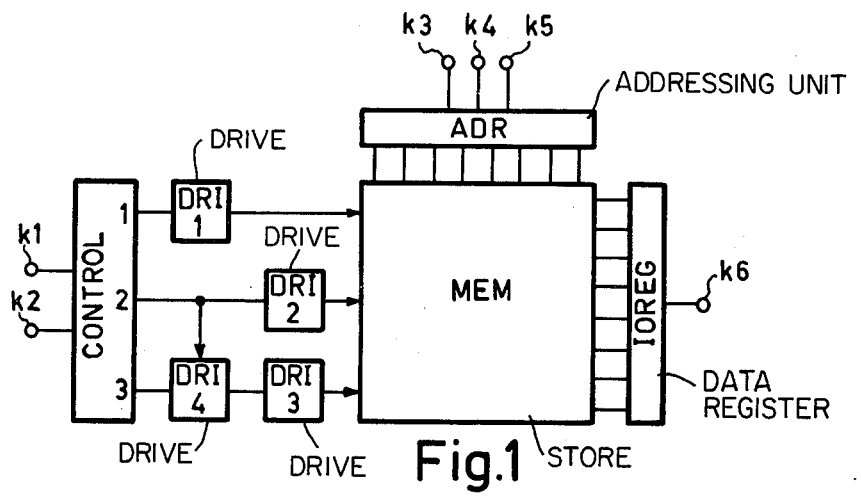
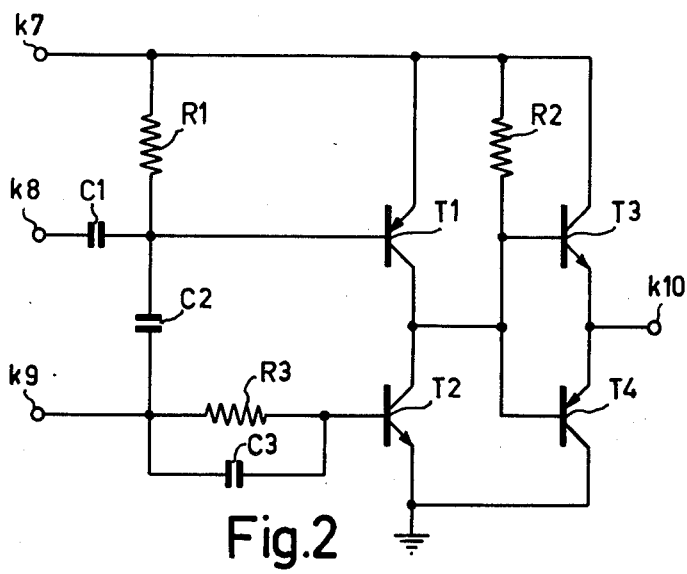
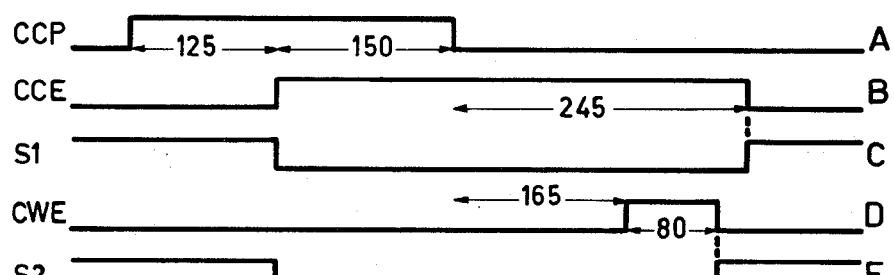

STORAGE DEVICE DRIVE CIRCUIT

The invention relates to a storage device, comprising a store, in particular an integrated solid-state store, an addressing unit for generating addresses, and a drive unit comprising outputs on which bivalent drive signals can be sequentially generated. Stores of this kind are known. The often require given narrow tolerances as regards the simultaneous appearance of given drive signals which are difficult to achieve. This problem is solved according to the invention by providing that at least two of the outputs are connected to inputs of an additional combinatory logical drive element which is capable of generating an output drive signal transition, so as to increase allowable tolerances between at least two signal transitions received thereby from the outputs within a memory cycle, under the control an arbitrary one of the latter signal transitions, depending on whichever is received first. The output drive signal can appear instead of one or more of the drive signals received by the additional drive element. Any difference in time between the occurence of the drive signals is thus rendered ineffective.

The additional drive element is preferably connected to an output of a write drive element. Depending on whether a read access or write access to the store is converned, a write drive signal is or is not generated. The output drive signal always appears, so that a correct operation is ensured. In the case of a write access, the write drive signal and the output drive signal are then properly synchronized.

The drive elements are preferably a write drive element and a selection drive element. The command signals "chip enable" and "write enable" can thus be correctly synchronized.

The invention will be described in detail hereinafter with reference to a number of FIGS. FIG. 1 shows a storage device according to the invention. FIG. 2 shows an additional drive element according to the invention. FIG. 3 shows a number of time diagrams.

FIG. 1 shows a storage device according to the invention, comprising a control unit CONTR, three drive elements DRI 1, 2, 3, an additional drive element DRI 4, an integrated solid-state store MEM, an addressing unit ADR, a date register IOREG, and six signal terminals K1 . . . 6.

Such integrated solid-state stores are known, so that they will not be elaborated herein. A number of binary address signals, for example, originating from an interrogation unit not shown, appear on the terminals k3, 4, 5. The addressing unit ADR may comprise a decoder and address amplifiers. Depending on the type of store, a number of bit locations or only one bit location may be addressed thereby. In the latter case the unit ADR may control a number of stores MEM concurrently. In the case of a read operation, data signals appear in the data register IOREG, from where they can be applied to a (possibly multiple) data terminal k6. The data register IOREG may also be disposed for driving a plurality of stores MEM. In the case of a write operation, the relevant information should be supplied from elsewhere via the (possibly multiple) terminal k6.

The terminals k1, 2 receive clock pulses and reset pulses. Under the control of the clock pulses, the control unit CONTR successively generates the primary drive signals CCP, the preparation clock signal (clock chip precharge), CCE, the release clock signal (clock chip enable), and in the case of a write operation CWE, the write clock signal (clock write enable). The latter signal does not appear in the case of a read operation.

FIG. 3 shows examples of the secondary drive signals then formed. The drive element DRI 1 forms, under the control of the unit CONTR, the signal on line A, the said signal having a duration of 275 ns. This drive element may comprise an output amplifier with the result that, for example, a larger number of stores MEM can be parallel driven. Similarly, the drive units DRI 2, 3 may comprise amplifiers. The signal on output 3 of the control unit CONTR is shown on line B in FIG. 3. This signal commences approximately 125 ns after the start of the signal on line A and has a duration of about 395 ns. If no signal is present on the output 2 of the control unit CONTR, the signal of line B is allowed passage in unmodified form and is inverted by the drive unit DRI 3: line C of FIG. 3; in such a case a read operation is concerned. If a signal appears on output 2 of the control unit CONTR, a write operation is concerned. The signal is shaped as shown on line D of FIG. 3: it commences 165 ns after the end of the signal on line A and it terminates approximately simultaneously with the signal on line B. The tolerances in this simultaneous termination are narrow. Therefore, this signal is also applied to the additional drive unit DRI 4, with the result that also the signal on line D can initiate the signal transition on line E. This is effected by the first negative-going signal transition on lines B and D: this transition causes the positive-going transition of the signal on line E.

FIG. 2 shows an additional drive element according to the invention, comprising four connection terminals k7 . . . 10, four transistors T1 . . . 4, three capacitors C1 . . . 3, and three resistors R1 . . . 3. Terminal k7 is connected to a power supply source having a voltage of, for example, 20 volts. The terminals k8, k9 are in the rest state at a low potential; they are connected to the outputs 2 and 3, respectively, of the control unit CONTR of FIG. 1. In the rest state the base electrode of transistor T2 is, therefore, at a low potential, with the result that the transistor is cut off. Consequently, its collector is at a high potential. There is little voltage drop between the emitter and collector electrodes of the transistor T1, with the result that the latter is conductive: the potential on the base electrode thereof is comparatively low and is determined by the voltage drop across the resistor R1 which is caused by the base current in transistor T1.

The base electrodes of the transistors T3, 4 are at a high potential, with the result that the transistor T3 is conductive and the transistor T4 is cut off. The terminal k10 is at a high potential. In the case of a memory access, the potential of terminal k9 becomes high (see FIG. 3). The combination formed by the resistor R3 and the capacitor C3 constitutes a differentiating network such that the potential of the base electrode of the transistor T2 quickly becomes high and the transistor becomes conductive. Via the capacitor C2, the potential of the base electrode of the transistor T1 also becomes high, with the result that this transistor is cut off. The base electrodes of the transistors T3, 4 thus receive a low potential. As a result, transistor T3 is cut off and transistor T4 becomes conductive. The terminal k10 then has a low potential. After some time, capacitor C3 is discharged across the resistor R3, so that the potentials of the base electrode of the transistor T2 and terminal K9 both remain high: transistor T2 remains conductive, while transistor T1 remains cut off. The setting of the base electrode of transistor T1 is maintained under the influence of the resistor R1, which has substantially no current flowing therethrough. If the potential of terminal k9 subsequently becomes low again, the reverse takes place and the initial situation is reached again.

The foregoing was applicable to the situation where no signal transitions occur on terminal k8. The terminal k9 is coupled for direct current to the base electrode of the transistor T2 and after the disappearance of the transition phenomena the output signal is determined by the potential on this terminal.

If terminal k9 is at a high potential and the potential of terminal k8 becomes high, nothing happens. If the potential of terminal k9 has already become low and the potential of terminal k8 becomes low, nothing happens either. However, if terminal k9 is still at a high potential and the potential of terminal k8 becomes low, this voltage drop is applied, via the capacitors C1, C2, C3, to the base electrode of the transistor T2. Transistor T2 is thus cut off and transistor T1 becomes conductive for a period in the order of the RC-time R1 × C1. It is assumed that the values of R1 × C1 and R3 × C3 are not substantially different. If the potential of terminal k9 also becomes low during this period, the situation is maintained. This is shown in FIG. 3, lines B and D: the transition instants of the signals CCE and CWE are near to each other and in such a case the output signal (line E) reacts to the first one of these two instants.

Something similar would be applicable if the value of the signals CCE and CWE becomes high. However, in that case the difference in time between the signals supplied by the control unit CONTR is so large (approximately 300 ns), that the tolerances do not have an effect. The tolerances in such a case amount to at the most a few tens of ns. They are caused by electronic effects in the control unit CONTR and by delay times of the signals in the conductors.

What is claimed is:
1. A storage device comprising
a store having a plurality of addressable storage locations;
an addressing unit for generating address of said storage locations;
a drive unit, having a plurality of outputs, for sequentially generating drive signals on said outputs; and
a combinatory logical drive element, having inputs connected to at least two of said outputs, for generating an output drive signal transition for increasing the allowable tolerance between at least two signal transitions of said drive signals from said outputs of said drive unit.

2. A storage device as defined in claim 1, wherein said combinatory logical device is controlled by one of said two signal transitions.

3. A storage device as defined in claim 1, wherein said combinatory logical device is controlled by the first one of said two signal transitions.

4. A storage device as defined in claim 1, further comprising a write drive element having an output connected to said combinatory logical drive element.

5. A storage device as defined in claim 1, wherein said drive unit includes a write drive element and a selection drive element.

6. A storage device as defined in claim 1, wherein said store is an integrated solid-state circuit.

* * * * *

UNITED STATES PATENT AND TRADEMARK OFFICE
CERTIFICATE OF CORRECTION

PATENT NO. : 3,931,616
DATED : January 6, 1976
INVENTOR(S) : HENDRIK KLOS

It is certified that error appears in the above-identified patent and that said Letters Patent are hereby corrected as shown below:

On the title page, section [45], change "Jan.6, 1975" to --Jan.6, 1976--.

Column 1, line 48, delete "that".

Signed and Sealed this sixth Day of April 1976

[SEAL]

Attest:

RUTH C. MASON
*Attesting Officer*

C. MARSHALL DANN
*Commissioner of Patents and Trademarks*